(12) United States Patent
Yang

(10) Patent No.: US 11,545,414 B2
(45) Date of Patent: Jan. 3, 2023

(54) ENHANCING CONVECTION AND COOLING IN A CIRCUIT BREAKER

(71) Applicant: Siemens Industry, Inc., Alpharetta, GA (US)

(72) Inventor: Guang Yang, Johns Creek, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 233 days.

(21) Appl. No.: 17/096,121

(22) Filed: Nov. 12, 2020

(65) Prior Publication Data
US 2022/0037230 A1 Feb. 3, 2022

Related U.S. Application Data

(60) Provisional application No. 63/058,004, filed on Jul. 29, 2020.

(51) Int. Cl.
*H01L 23/467* (2006.01)
*H01L 25/00* (2006.01)

(52) U.S. Cl.
CPC ............ *H01L 23/467* (2013.01); *H01L 25/00* (2013.01)

(58) Field of Classification Search
CPC .............................. H01L 23/467; H01L 25/00
USPC ........................................................ 257/546
See application file for complete search history.

(56) References Cited

U.S. PATENT DOCUMENTS

| | | | | |
|---|---|---|---|---|
| 4,965,544 A | * | 10/1990 | Kelaita, Jr. | ............ H02B 1/056 200/305 |
| 2012/0120558 A1 | * | 5/2012 | Raabe | ..................... H01H 9/342 361/619 |
| 2014/0332502 A1 | * | 11/2014 | Feil | .......................... H01H 9/52 218/155 |

* cited by examiner

*Primary Examiner* — Sheng-Bai Zhu

(57) ABSTRACT

A circuit breaker with enhanced convection and cooling comprises a housing having a first portion and a second portion. The circuit breaker further comprises one or more first orientation features formed onto the first portion of the housing. The circuit breaker further comprises one or more second orientation features formed onto the second portion of the housing such that the one or more first orientation features are different from the one or more second orientation features and the first portion of the housing is different than the second portion of the housing. The one or more first orientation features and the one or more second orientation features are assembled together to form air channels to allow air to go in and out while preventing a solid object from protruding and from touching inside components of the circuit breaker.

9 Claims, 7 Drawing Sheets

View A-A'

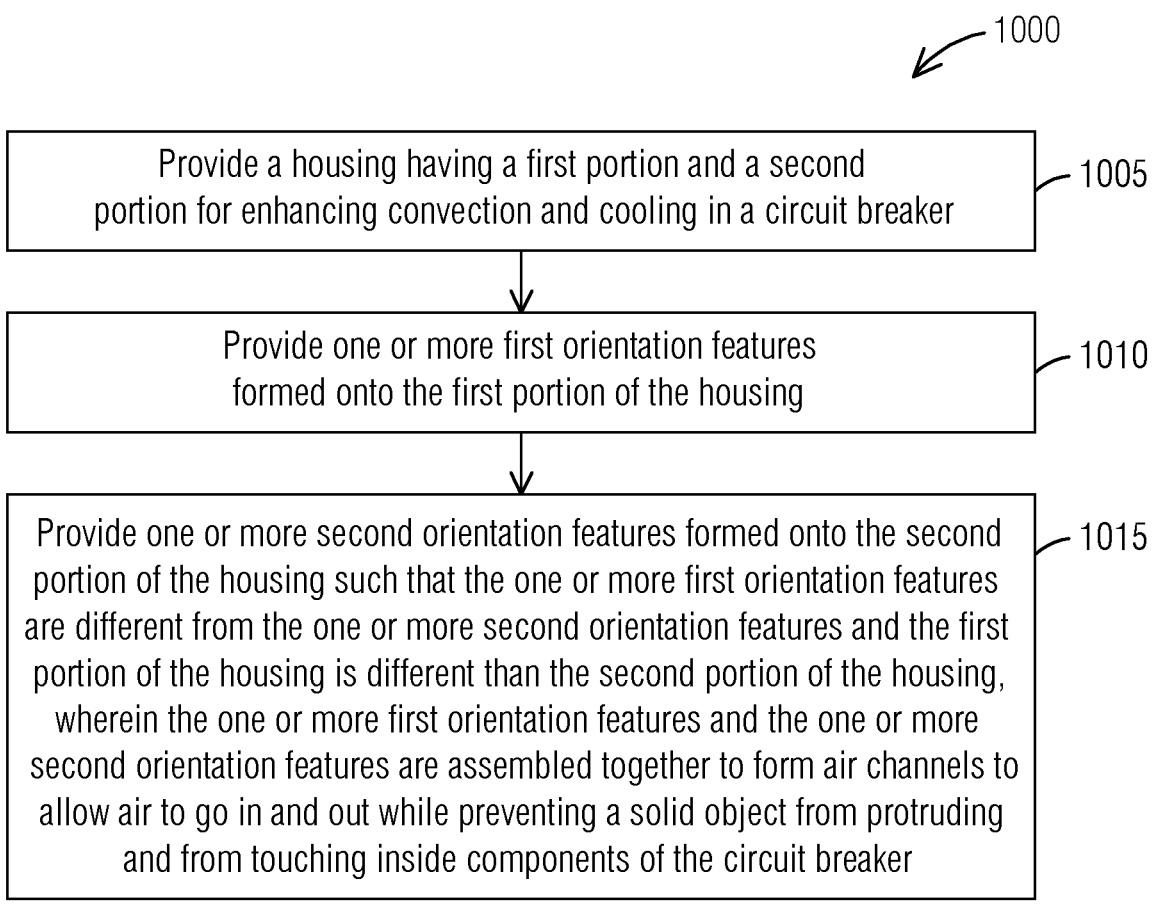

ENHANCING CONVECTION AND COOLING IN A CIRCUIT BREAKER

CROSS REFERENCE TO RELATED APPLICATIONS

This application claims priority from a provisional patent application of U.S. Ser. No. 63/058,004, filed Jul. 29, 2020, which is incorporated by reference herein in its entirety.

BACKGROUND

1. Field

Aspects of the present invention generally relate to enhancing convection and cooling in a circuit breaker.

2. Description of the Related Art

Circuit breakers are essential for electrical safeties. They feed current to loads that are connected to them and interrupt the circuit once a circuit fault such as an overload, a short circuit, a ground fault and an arc fault is detected. Due to the nature of carrying current heat is generated inside circuit breakers and this is especially significant for solid state-based circuit breakers. To ensure safe operations of circuit breakers, proper cooling is necessary.

For solid state circuit breakers, direct cooling components such as heat pipes and heat sinks are normally used for thermal management. Natural convection is not normally considered to the best of knowledge.

Therefore, there is a need for a better thermal management in a circuit breaker.

SUMMARY

Briefly described, aspects of the present invention relate to thermal management in a circuit breaker. The objective of the described invention is to enhance convection and cooling in a circuit breaker. This invention describes a circuit breaker housing design that enhances air flow and convection, and therefore improves cooling of the circuit breakers. This invention is targeting natural convection-based cooling for certain small amperage circuit breakers. There are two problems solved in this invention to enhance natural convection. First, each circuit breaker needs to have air circulation without direct access to the internal parts. Second, an enclosure can have multiple circuit breakers installed in a crowdy manner, therefore, air circulation cannot be blocked in such setup.

In accordance with one illustrative embodiment of the present invention, a circuit breaker having a perimeter comprises a housing having a first portion and a second portion. It comprises one or more first orientation features formed onto the first portion of the housing. It further comprises one or more second orientation features formed onto the second portion of the housing such that the one or more first orientation features are different from the one or more second orientation features and the first portion of the housing is different than the second portion of the housing. The one or more first orientation features and the one or more second orientation features are assembled together to form air channels to allow air to go in and out while preventing a solid object from protruding and from touching inside components of the circuit breaker.

In accordance with one illustrative embodiment of the present invention, a method for enhancing convection and cooling in a circuit breaker comprises a step of providing a housing having a first portion and a second portion. The method further comprises providing one or more first orientation features formed onto the first portion of the housing. The method further comprises providing one or more second orientation features formed onto the second portion of the housing such that the one or more first orientation features are different from the one or more second orientation features and the first portion of the housing is different than the second portion of the housing. The one or more first orientation features and the one or more second orientation features are assembled together to form air channels to allow air to go in and out while preventing a solid object from protruding and from touching inside components of the circuit breaker.

In accordance with one illustrative embodiment of the present invention, a load center comprises a first circuit breaker and a second circuit breaker. The first circuit breaker includes a first housing with one or more first orientation features formed onto the first housing and one or more second orientation features formed onto the first housing such that the one or more first orientation features are different from the one or more second orientation features. The one or more first orientation features and the one or more second orientation features are assembled together to form a first air channel to allow air to go in and out while preventing a first solid object from protruding and from touching inside components of the first circuit breaker. The second circuit breaker includes a second housing with one or more third orientation features formed onto the second housing and one or more fourth orientation features formed onto the second housing such that the one or more third orientation features are different from the one or more fourth orientation features. The one or more third orientation features and the one or more fourth orientation features are assembled together to form a second air channel to allow air to go in and out while preventing a second solid object from protruding and from touching inside components of the second circuit breaker. The load center further comprises breaker housing features that allow the first and second circuit breakers to form openings or channels so that air flows in and out of the first and second air channels.

BRIEF DESCRIPTION OF THE DRAWINGS

FIG. 10 illustrates a schematic view of a flow chart of a method for enhancing convection and cooling in a circuit breaker in accordance with an exemplary embodiment of the present invention.

DETAILED DESCRIPTION

Figure 1:
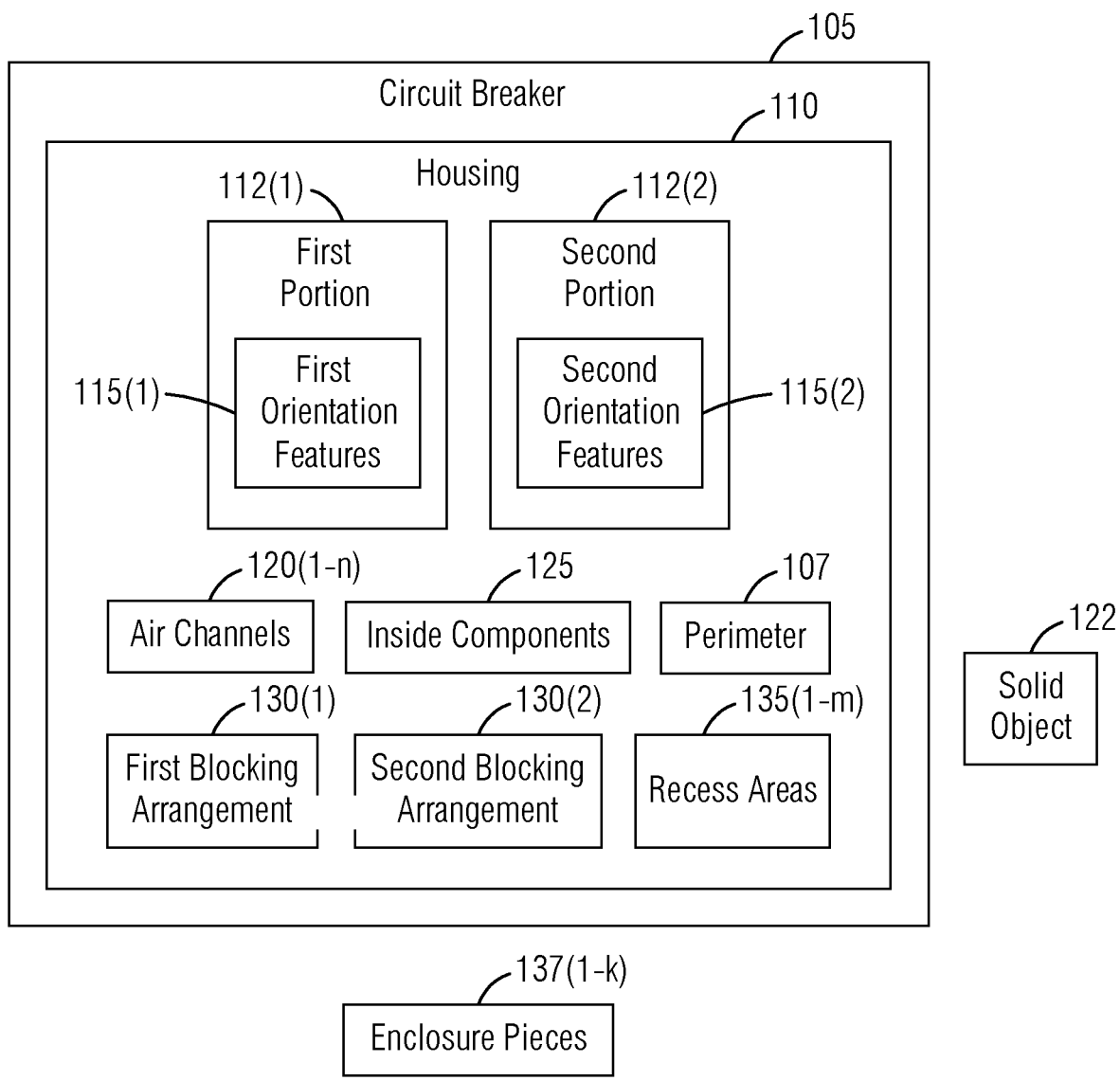
FIG. 1 illustrates a block diagram of a circuit breaker in accordance with an exemplary embodiment of the present invention.

To facilitate an understanding of embodiments, principles, and features of the present invention, they are explained hereinafter with reference to implementation in illustrative embodiments. In particular, they are described in the context of a circuit breaker capable of passive thermal management based on air channels and recesses. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

These and other embodiments of the circuit breaker according to the present disclosure are described below with reference to FIGS. 1-10 herein. Like reference numerals used in the drawings identify similar or identical elements throughout the several views. The drawings are not necessarily drawn to scale.

Aspects of the present invention generally relate to circuit breaker housing design for enhanced convection and cooling. A circuit breaker housing design enables natural convection-based cooling. Horizontal block features and vertical block features form air channels to allow air to go in and out. Recess areas formed to allow air to circulate. Breaker housing features allow multiple circuit breakers to form openings or channels.

Consistent with one embodiment of the present invention, FIG. 1 represents a block diagram of a circuit breaker 105 in accordance with an exemplary embodiment of the present invention. The circuit breaker 105 has a perimeter 107. The circuit breaker 105 comprises a housing 110 having a first portion 112(1) and a second portion 112(2). One or more first orientation features 115(1) are formed onto the first portion 112(1) of the housing 110. One or more second orientation features 115(2) are formed onto the second portion 112(2) of the housing 110 such that the one or more first orientation features 115(1) are different from the one or more second orientation features 115(2) and the first portion 112(1) of the housing 110 is different than the second portion 112(2) of the housing 110. The one or more first orientation features 115(1) and the one or more second orientation features 115(2) are assembled together to form air channels 120(1-$n$) to allow air to go in and out while preventing a solid object 122 from protruding and from touching inside components 125 of the circuit breaker 105.

In one embodiment, the one or more first orientation features 115(1) are horizontal block features. In one embodiment, the one or more second orientation features 115(2) are vertical block features. According to one embodiment, the first portion 112(1) of the housing 110 is two outer covers. According to one embodiment, the second portion 112(2) of the housing 110 is two inner halves. The horizontal block features and the vertical block features provide a horizontal blocking arrangement and a vertical blocking arrangement along the perimeter 107 of the circuit breaker 105 to maximize an air channel 120.

The one or more first orientation features 115(1) and the one or more second orientation features 115(2) provide a first blocking arrangement 130(1) and a second blocking arrangement 130(2) along the perimeter 107 of the circuit breaker 105 to maximize an air channel 120. The housing 110 comprises two outer covers and two inner halves. The circuit breaker 105 further comprises recess areas 135(1-$m$) formed to allow air to circulate even one or more enclosure pieces 137(1-$k$) touch a surface of the circuit breaker 105.

Figure 2:
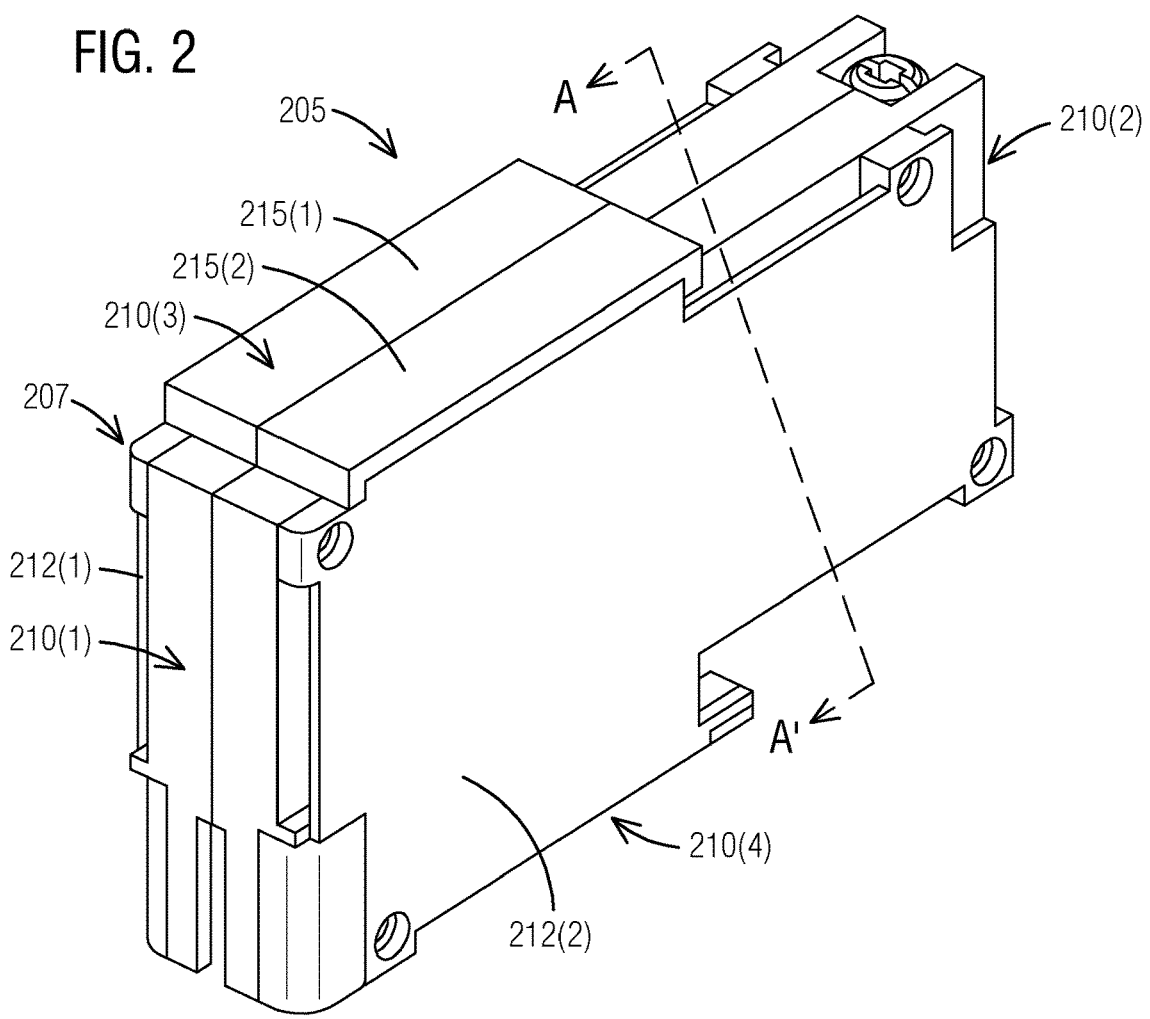
FIG. 2 illustrates a circuit breaker in accordance with an exemplary embodiment of the present invention.

Referring to FIG. 2, it illustrates a circuit breaker 205 in accordance with an exemplary embodiment of the present invention. The circuit breaker 205 needs to have air circulation without direct access to its internal parts. To this end, the circuit breaker 205 has a housing 207 designed as in FIG. 2. Various ends of the circuit breaker 205 are defined in FIG. 2. The circuit breaker 205 includes a front end 210(1), a back end 210(2), a top end 210(3) and a bottom end 210(4). In this example, the housing 207 comprises four parts, two outer covers 212(1-2), and two inner halves 215(1-2). Different number of housing components can be used to achieve the same purpose.

Figure 3:
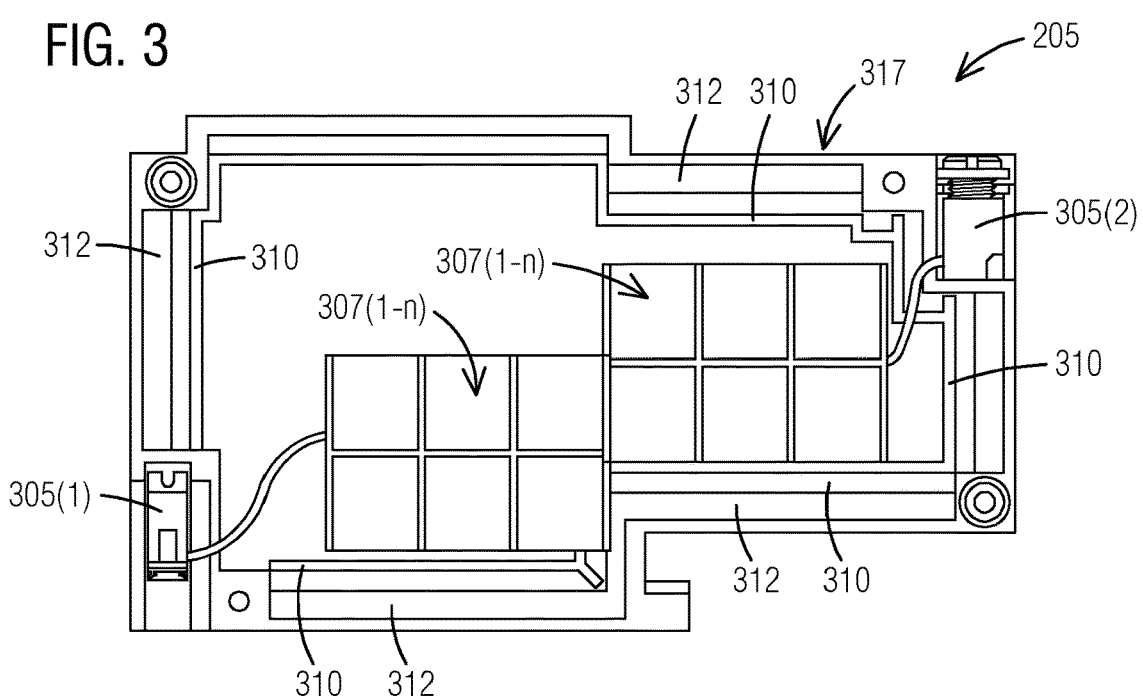
FIG. 3 illustrates a side view of inner structures and components of the circuit breaker of FIG. 2 in accordance with an exemplary embodiment of the present invention.

Turning now to FIG. 3, it illustrates a side view of inner structures and components of the circuit breaker 205 of FIG. 2 in accordance with an exemplary embodiment of the present invention. As an example, a current in terminal 305(1), a group of solid-state switching modules 307(1-$n$) and a current out terminal 305(2) are housed in the circuit breaker 205 as current conducting and switching components. The housing 207 comprises four parts, two outer covers 212(1-2), and two inner halves 215(1-2).

Figure 5:
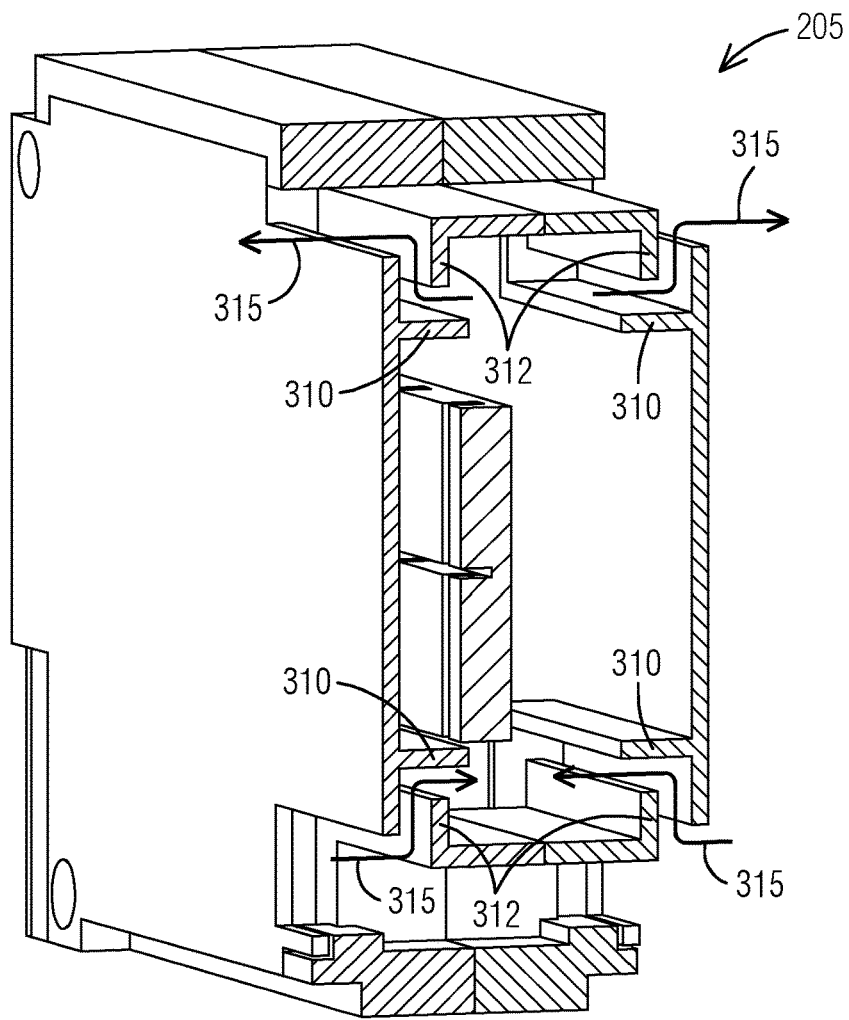
FIG. 5 illustrates a cross-sectional view at a line A-A' in FIG. 2 showing air channels formed by horizontal block features and vertical block features in accordance with an exemplary embodiment of the present invention.

Horizontal block features 310 are built onto the two outer covers 212(1-2), and vertical block features 312 are built onto the two inner halves 215(1-2). Once assembled together, the horizontal block features 310 and the vertical block features 312 form air channels 315 (see FIG. 5) to allow air to go in and out while preventing a solid object, such as screw drivers, from protruding and from touching the inside components, as shown in FIG. 5. Such a horizontal and vertical blocking arrangement is used along a perimeter 317 of the circuit breaker 205 to maximize an air channel 315. This way, natural convection can happen while keeping the circuit breaker 205 enclosed.

Figure 4:
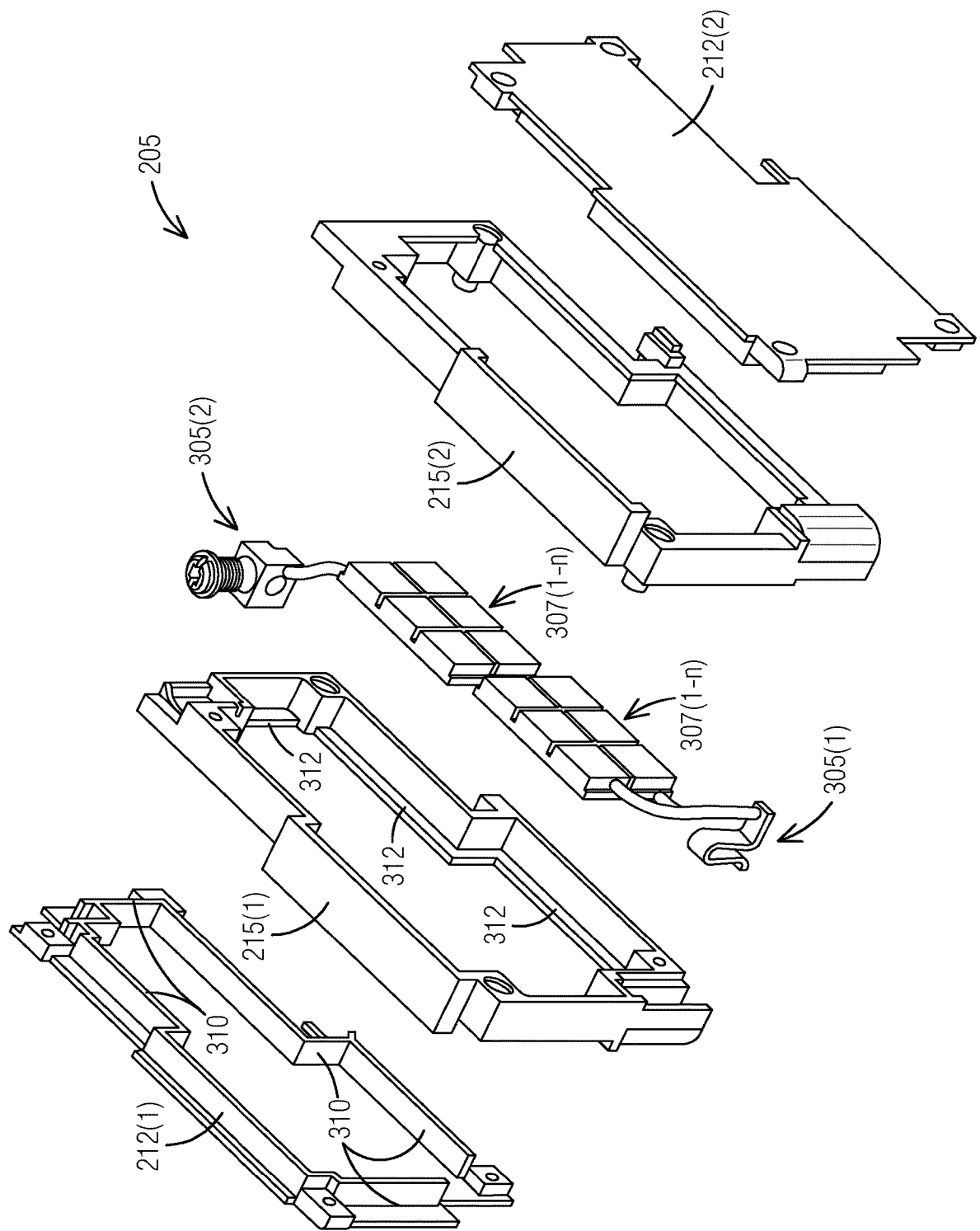
FIG. 4 illustrates an exploded view of inner structures and components of the circuit breaker of FIG. 2 in accordance with an exemplary embodiment of the present invention.

FIG. 4 illustrates an exploded view of inner structures and components of the circuit breaker 205 of FIG. 2 in accordance with an exemplary embodiment of the present invention. As seen in FIG. 5, it illustrates a cross-sectional view at a line A-A' in FIG. 2 showing the air channels 315 formed by the horizontal block features 310 and the vertical block features 312 in accordance with an exemplary embodiment of the present invention. The horizontal block features 310 and the vertical block features 312 extend in a direction perpendicular to each other. That is, the horizontal block features 310 extend in a first direction and the vertical block features 312 extend in a second direction such that the first direction is perpendicular to the second direction. The horizontal block features 310 and the vertical block features 312 are oriented facing opposite to each other when assembled.

Figure 6:
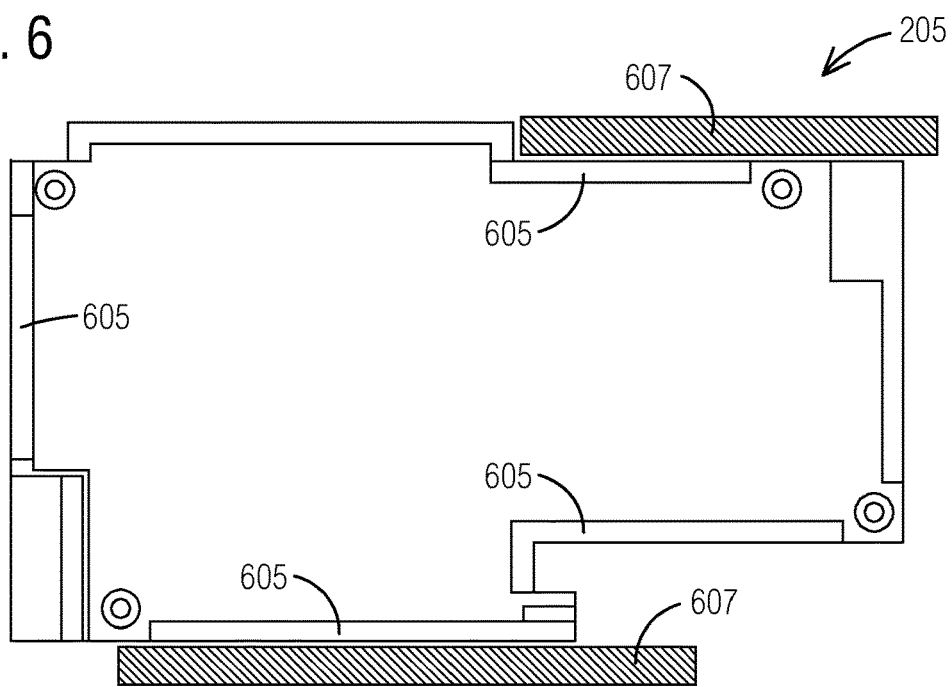
FIG. 6 illustrates a view of recess features to avoid enclosure pieces in accordance with an exemplary embodiment of the present invention.

FIG. 6 illustrates a view of recess features or areas 605 to avoid enclosure pieces 607 in accordance with an exemplary embodiment of the present invention. An enclosure can have multiple circuit breakers installed in a crowdy manner, but air circulation is not blocked in such a setup. It is possible the enclosure pieces 607 could block the air channel 315 formed by the vertical block features 312 and the horizontal block features 310.

To avoid such blockage, the recess features or areas 605 are formed to allow air to circulate even the enclosure pieces 607 touch the surface of the circuit breaker 205. Such recess features or areas 605 are used in the places where the enclosure pieces 607 are likely to touch and in places where breakers may touch each other, as shown in FIG. 6.

Figure 7:
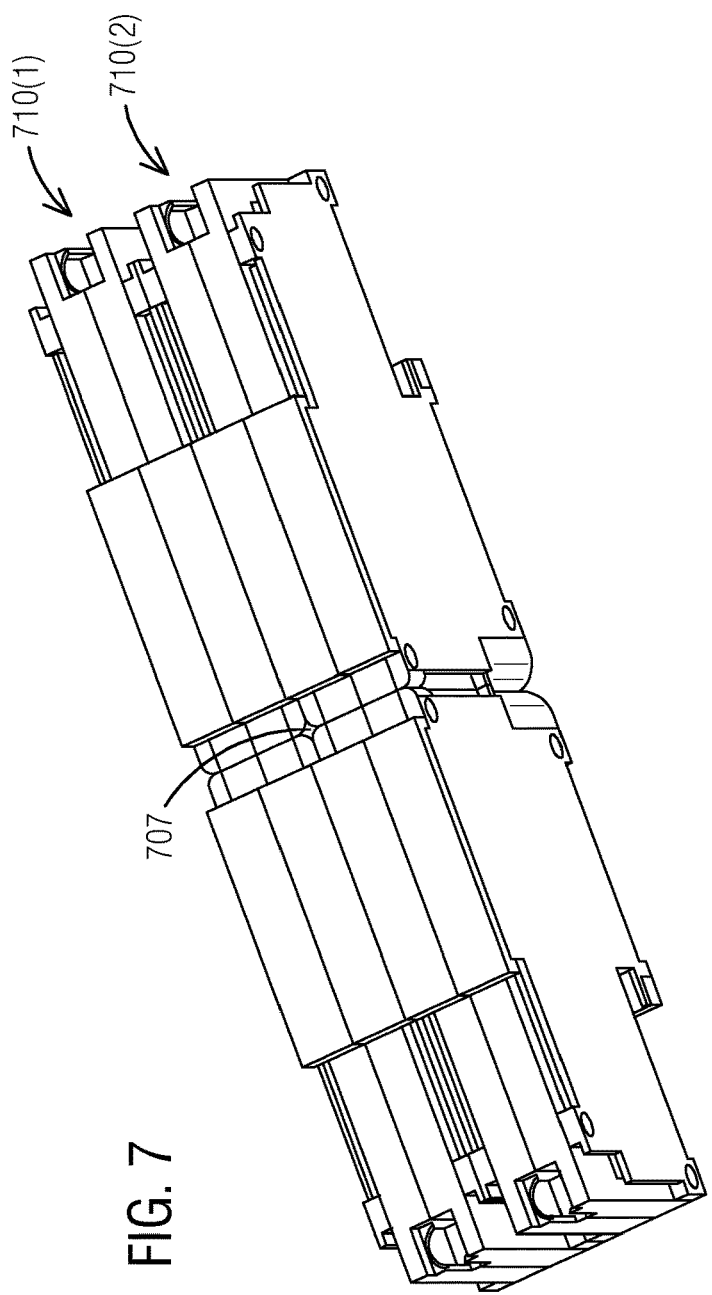
FIG. 7 illustrates a view of an opening formed at a top end among two adjacent breakers in accordance with an exemplary embodiment of the present invention.
Figure 8:
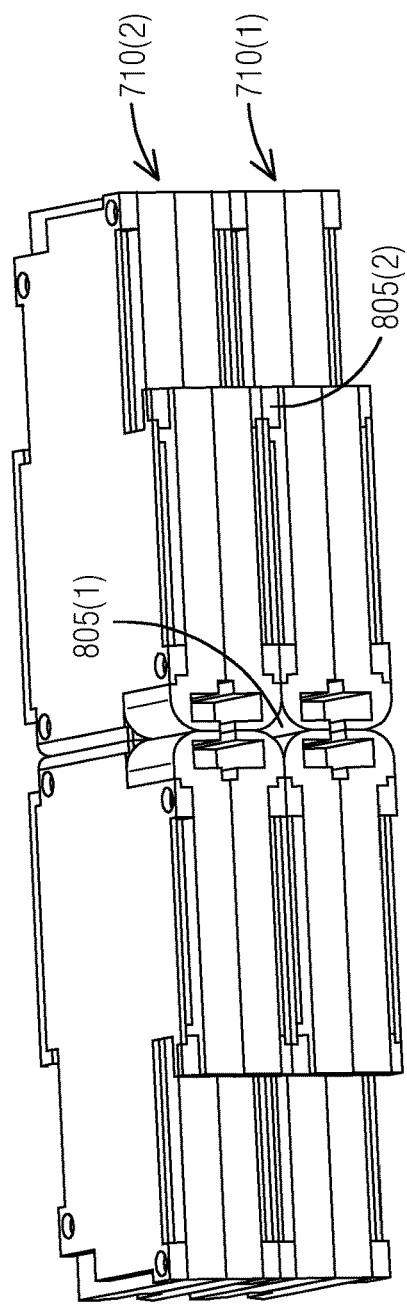
FIG. 8 illustrates a view of an opening and channels formed at a bottom end among two adjacent breakers in accordance with an exemplary embodiment of the present invention.

Also, in an enclosure 705, multiple circuit breakers may be placed closed to each other, as shown in FIG. 7 and FIG. 8. In FIG. 7, it illustrates a view of an opening 707 formed at a top end among two adjacent breakers 710(1-2) in accordance with an exemplary embodiment of the present invention. With regard to FIG. 8, it illustrates a view of openings 805(1-2) and channels formed at a bottom end among two adjacent breakers in accordance with an exemplary embodiment of the present invention.

The air channels 315 formed by the horizontal block features 310 and the vertical block features 312 are already helpful in such situation, since they form air channels internal of a beaker, so the neighbor breaker doesn't change the channel size. However, it is likely that air doesn't have access to the channels on the front end 210(1) and bottom end 210(4), if breakers are tightly packed as in FIGS. 7 and 8. To solve such issue, the breaker housing features such as the recess features or areas 605, as shown in FIGS. 7 and 8, are used. These features allow the multiple breakers 710(1-2) to form openings or channels, so that air can flow in and out of individual breaker air channels.

Together with all the features above, air can circulate inside the circuit breaker 205 even if they are packed together in the enclosure 705, and natural convection is improved for better cooling. This design has its simplicity by building air circulating features into the housing of the circuit breaker 205. It doesn't require additional cooling, such as external heat sinks or heat pipes, and will eliminate those cost for the breakers only need slight extra cooling.

Figure 9:
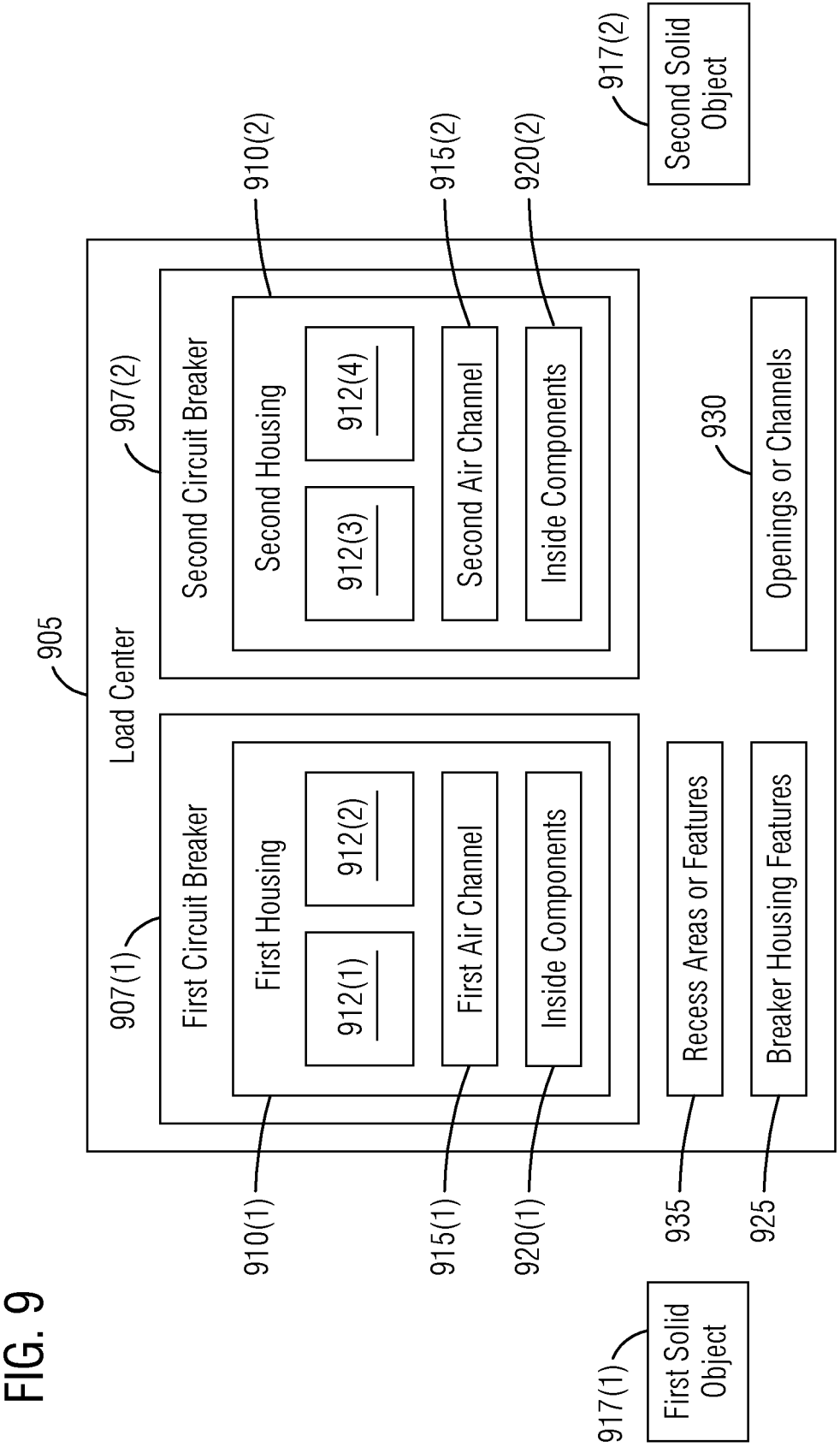
FIG. 9 illustrates a block diagram of a load center comprising a first circuit breaker and a second circuit breaker in accordance with an exemplary embodiment of the present invention.

With respect to FIG. 9, it illustrates a block diagram of a load center 905 comprising a first circuit breaker 907(1) and a second circuit breaker 907(2) in accordance with an exemplary embodiment of the present invention. The first circuit breaker 907(1) includes a first housing 910(1) with one or more first orientation features 912(1) formed onto the first housing 910(1). One or more second orientation features 912(2) are formed onto the first housing 910(1) such that the one or more first orientation features 912(1) are different from the one or more second orientation features 912(2). The one or more first orientation features 912(1) and the one or more second orientation features 912(2) are assembled together to form a first air channel 915(1) to allow air to go in and out while preventing a first solid object 917(1) from protruding and from touching inside components 920(1) of the first circuit breaker 907(1).

The second circuit breaker 907(2) includes a second housing 910(2) with one or more third orientation features 912(3) formed onto the second housing 910(2). One or more fourth orientation features 912(4) are formed onto the second housing 910(2) such that the one or more third orientation features 912(3) are different from the one or more fourth orientation features 912(4). The one or more third orientation features 912(3) and the one or more fourth orientation features 912(4) are assembled together to form a second air channel 915(2) to allow air to go in and out while preventing a second solid object 917(2) from protruding and from touching inside components 920(2) of the second circuit breaker 907(2).

The load center 905 further comprises breaker housing features 925 that allow the first and second circuit breakers 907(1-2) to form openings or channels 930 so that air flows in and out of the first and second air channels 915(1-2). In one embodiment, the one or more first orientation features 912(1) and the one or more third orientation features 912(3) are horizontal block features and the one or more second orientation features 912(2) and the one or more fourth orientation features 912(4) are vertical block features. The load center 905 further comprises a plurality of recess areas or features 935 to avoid blocking corresponding air channels with enclosure pieces or an adjacent circuit breaker.

FIG. 10 illustrates a schematic view of a flow chart of a method 1000 for enhancing convection and cooling in the circuit breaker 205 in accordance with an exemplary embodiment of the present invention. Reference is made to the elements and features described in FIGS. 1-9. It should be appreciated that some steps are not required to be performed in any particular order, and that some steps are optional.

The method 1000 comprises a step 1005 of providing a housing having a first portion and a second portion. The method 1000 further comprises a step 1010 of providing one or more first orientation features formed onto the first portion of the housing. The method 1000 further comprises a step 1015 of providing one or more second orientation features formed onto the second portion of the housing such that the one or more first orientation features are different from the one or more second orientation features and the first portion of the housing is different than the second portion of the housing. The one or more first orientation features and the one or more second orientation features are assembled together to form air channels to allow air to go in and out while preventing a solid object from protruding and from touching inside components of the circuit breaker 205.

While horizontal block features and vertical block features are described here a range of one or more other types of structures or other forms of structures are also contemplated by the present invention. For example, other types of structures may be implemented based on one or more features presented above without deviating from the spirit of the present invention.

The techniques described herein can be particularly useful for a housing of a circuit breaker including four parts as two outer covers and two inner halves. While particular embodiments are described in terms of specific configuration of a circuit breaker, the techniques described herein are not limited to such a limited configuration but can also be used with other configurations and types of circuit breakers.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A solid-state circuit breaker having a perimeter, the solid-state circuit breaker comprising:
   a housing having a first portion and a second portion;
   one or more first orientation features formed onto the first portion of the housing; and
   one or more second orientation features formed onto the second portion of the housing such that the one or more first orientation features are different from the one or more second orientation features and the first portion of the housing is different than the second portion of the housing,
   wherein the one or more first orientation features and the one or more second orientation features are assembled together to form air channels to allow air to go in and out while preventing a solid object from protruding,
   wherein the one or more first orientation features are horizontal block features,
   wherein the one or more second orientation features are vertical block features,
   wherein the horizontal block features and the vertical block features provide a horizontal blocking arrangement and a vertical blocking arrangement along the perimeter of the solid-state circuit breaker to provide an air channel in such a way that there is no direct access to internal parts of the solid-state circuit breaker and the air channel allows air to go in and out while preventing a solid object from touching the internal parts of the solid-state circuit breaker,
   wherein recess areas are formed to allow air to circulate such that air circulation is not blocked in an installation arrangement of multiple solid-state circuit breakers and each solid-state circuit breaker is capable of a passive thermal management based on the air channel and the recess areas.

2. The solid-state circuit breaker of claim 1, wherein the first portion of the housing is two outer covers.

3. The solid-state circuit breaker of claim 2, wherein the second portion of the housing is two inner halves.

4. The solid-state circuit breaker of claim 1, wherein the one or more first orientation features and the one or more second orientation features provide a first blocking arrangement and a second blocking arrangement along the perimeter of the circuit breaker to maximize an air channel.

5. The solid-state circuit breaker of claim 4, wherein the housing comprises two outer covers and two inner halves.

6. A method for enhancing convection and cooling in a solid-state circuit breaker, the method comprising:
providing a housing having a first portion and a second portion;
providing one or more first orientation features formed onto the first portion of the housing; and
providing one or more second orientation features formed onto the second portion of the housing such that the one or more first orientation features are different from the one or more second orientation features and the first portion of the housing is different than the second portion of the housing,
wherein the one or more first orientation features and the one or more second orientation features are assembled together to form air channels to allow air to go in and out while preventing a solid object from protruding,
wherein the one or more first orientation features are horizontal block features,
wherein the one or more second orientation features are vertical block features,
wherein the horizontal block features and the vertical block features provide a horizontal blocking arrangement and a vertical blocking arrangement along the perimeter of the solid-state circuit breaker to provide an air channel in such a way that there is no direct access to internal parts of the solid-state circuit breaker and the air channel allows air to go in and out while preventing a solid object from touching the internal parts of the solid-state circuit breaker,
wherein recess areas are formed to allow air to circulate such that air circulation is not blocked in an installation arrangement of multiple solid-state circuit breakers and each solid-state circuit breaker is capable of a passive thermal management based on the air channel and the recess areas.

7. The method of claim 6, wherein the first portion of the housing is two outer covers and wherein the second portion of the housing is two inner halves.

8. The method of claim 6, wherein the one or more first orientation features and the one or more second orientation features provide a first blocking arrangement and a second blocking arrangement along the perimeter of the circuit breaker to maximize an air channel.

9. The method of claim 8, wherein the housing comprises two outer covers and two inner halves.

\* \* \* \* \*